(12) United States Patent
Watanabe et al.

(10) Patent No.: US 8,574,449 B2
(45) Date of Patent: Nov. 5, 2013

(54) METHOD FOR MANUFACTURING PRINTED WIRING BOARD

(75) Inventors: Hirohito Watanabe, Sakura (JP); Taiji Ogawa, Sakura (JP); Takaomi Tomonaga, Sakura (JP); Eriko Tomonaga, legal representative, Sakura (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 13/462,399

(22) Filed: May 2, 2012

(65) Prior Publication Data
US 2012/0279050 A1   Nov. 8, 2012

Related U.S. Application Data

(63) Continuation of application No. PCT/JP2010/071921, filed on Dec. 7, 2010.

(30) Foreign Application Priority Data

Mar. 23, 2010   (JP) ................................. 2010-065908

(51) Int. Cl.
*B44C 1/22*   (2006.01)
(52) U.S. Cl.
USPC ................ 216/84; 216/13; 216/100; 438/754
(58) Field of Classification Search
USPC ......... 216/13, 17, 18, 33, 34, 19, 32, 84, 100; 438/5, 14, 622, 754
See application file for complete search history.

(56) References Cited

U.S. PATENT DOCUMENTS

| 2004/0108862 | A1* | 6/2004 | Azuma et al. | 324/691 |
| 2005/0036783 | A1* | 2/2005 | Morita et al. | 396/611 |
| 2006/0207888 | A1* | 9/2006 | Taylor et al. | 205/646 |

FOREIGN PATENT DOCUMENTS

| JP | 63-43392 A | 2/1988 |
| JP | 3-159161 A | 7/1991 |
| JP | 7-104138 B2 | 9/1992 |
| JP | 7-273426 A | 10/1995 |
| JP | 8-242059 A | 9/1996 |
| JP | 9-162522 A | 6/1997 |
| JP | 9-205170 A | 8/1997 |

(Continued)

OTHER PUBLICATIONS

International Search Report for PCT/JP2010/071921 dated Mar. 15, 2011.

(Continued)

*Primary Examiner* — Lan Vinh
(74) *Attorney, Agent, or Firm* — Sughrue Mion, PLLC

(57) ABSTRACT

Quickly making changes to etching conditions suppresses the production yield of printed wiring boards from being deteriorated. Disclosed is a method comprising: an etching step that comprises: preparing a conductor-clad base material continuous in a certain direction, the conductor-clad base material (1) having an insulating layer and one or more conductive layers formed on main surfaces of the insulating layer; and subjecting a predetermined region of a conductor layer of one main surface of the conductor-clad base material (1) to an etching process thereby to form a wiring pattern (1a) to be of a product and an inspection pattern (1b) to be used for inspection; a measuring step that measures a line width of the inspection pattern after the etching step; and a control step that controls an etching condition in the etching step based on the measured line width.

6 Claims, 4 Drawing Sheets

(56) References Cited

FOREIGN PATENT DOCUMENTS

| | | |
|---|---|---|
| JP | 10-145029 A | 5/1998 |
| JP | 2003-17830 A | 1/2003 |
| JP | 2004-207611 A | 7/2004 |

OTHER PUBLICATIONS

Office Action issued by the Japanese Patent Office in Japanese Application No. 2012-506773 dated Apr. 2, 2013.

* cited by examiner

METHOD FOR MANUFACTURING PRINTED WIRING BOARD

BACKGROUND OF THE INVENTION

1. Technical Field of the Invention

The present invention relates to a method for manufacturing a printed wiring board, the method including an etching step.

For those designated countries which permit the incorporation by reference, the contents described and/or illustrated in the documents relevant to Patent Application No. 2010-065908 filed with Japan Patent Office on Mar. 23, 2010 will be incorporated herein by reference, as a part of the description and/or drawings of the present application.

2. Description of the Related Art

In continuous manufacturing steps according to reel-to-reel (R-R) method, an etching step for forming wiring patterns is followed by a terminal plating process step, a finishing step and cutting step, which are continuously performed. In addition, after completing all these steps, inspections are performed for wiring widths of completed printed wiring boards.

As an approach for this kind of inspecting wiring widths, known in the art is an approach in which wiring patterns are exposed to laser light and electromagnetic wave, and widths of base portions of wiring patterns (boundaries between copper foils and base material) are measured from the reflected light and fluorescence X-ray light (Patent Document 1: Japanese examined Patent Publication No. H7-104138).

Line widths of wiring patterns formed with printed wiring boards are affected by etching process, and therefore, if any abnormality is detected in line widths, then it is contemplated whether the etching conditions at the moment are appropriate or not, and necessary changes are made to the etching conditions for subsequent execution.

PRIOR ART DOCUMENT(S)

Patent Document(s)

[Patent Document 1] Japanese examined Patent Publication No. H7-104138

SUMMARY OF THE INVENTION

Problems to be Solved by the Invention

According to the conventional manufacturing method, however, the measurement of wiring widths performed after having completed printed wiring boards requires long time from the completion time of the etching process to the moment of inspecting wiring widths, and the determining whether the etching conditions are appropriate or not and the making changes to the etching conditions are delayed thereby to deteriorate the production yield.

Problems to be solved by the present invention include providing a method for manufacturing a printed wiring board, in which the production yield is suppressed from being deteriorated, by reducing the duration from the completion time of the etching process to the moment of inspecting wiring widths and quickly performing to make changes to the etching conditions.

Means for Solving the Problems

The present invention solves the above problems by providing a method for manufacturing a printed wiring board, the method comprising: an etching step that comprises: preparing a conductor-clad base material continuous in a certain direction, the conductor-clad base material having an insulating layer and one or more conductive layers formed on main surfaces of the insulating layer; and subjecting a predetermined region of a conductor layer of one main surface of the conductor-clad base material to an etching process thereby to form a wiring pattern to be of a product and an inspection pattern to be used for inspection; a measuring step that measures a line width of the inspection pattern after the etching step; and a control step that controls an etching condition in the etching step based on the measured line width.

In the above invention, the control step may refer to correspondence information which preliminarily associates the line width of the inspection pattern and the etching condition in the etching step with each other, and control the etching condition based on the measured line width.

In the above invention, the inspection pattern may be configured as being a plurality of line-like patterns parallel to one another along the certain direction, and each of the line-like patterns may have a predetermined line width.

In the above invention, the inspection pattern may be configured as being three or more line-like patterns.

In the above invention, if each difference between line widths of the plurality of line-like patterns is less than a predetermined value, then the control step may control the etching condition based on the line widths of that plurality of line-like patterns, whereas if each difference between line widths of the plurality of line-like patterns is more than or equal to the predetermined value, then the control step may determine that plurality of line-like patterns as not being the inspection pattern and stop controlling the etching condition based on the line widths of that plurality of line-like patterns.

In the above invention, the inspection pattern may include inspection patterns positioned at different positions in substantially perpendicular direction to the certain direction, and the control step may control etching conditions corresponding to respective inspection patterns based on line widths of the respective inspection patterns measured in the measuring step.

In the above invention, the measuring step may take an image of the inspection pattern from one main surface side of the conductor-clad base material in a state of the inspection pattern being exposed to light from other main surface side of the conductor-clad base material, and measure the line width of the inspection pattern based on the taken image.

In the above invention, the measuring step may emit laser light from one main surface side of the conductor-clad base material to the inspection pattern and measure the line width of the inspection pattern based on transmitted light of the laser light.

Advantageous Effect of the Invention

According to the present invention, the etching conditions are controlled based on line widths, which are measured after the etching step, of the inspection patterns formed under the same etching conditions as the wiring patterns, thereby to allow for performing the measurement of line widths and making changes to etching conditions even immediately after the etching step. As a result, the production yield is suppressed from being deteriorated due to insufficient etching conditions.

DESCRIPTION OF THE PREFERRED EMBODIMENT

Hereinafter, the method for manufacturing a printed wiring board according to embodiments of the present invention will be described with reference to the drawings.

The method for manufacturing a printed wiring board according to embodiments of the present invention includes a pre-etching process step, an etching step (including a control step for etching conditions), a post-etching process step, a measuring step, and a finishing step.

Specifically, the pre-etching process step in the present embodiment includes a surface conditioning process for a base material, a forming process for photo sensitive resist, an exposure process, and an image developing process; the etching step includes a process for forming wiring patterns and inspection patterns by removing a conductor layer within a predetermined region; and the post-etching process step includes a cleaning process, a resist stripping process, a cleaning process after resist stripping, and a drying process. In addition, the finishing step includes forming plated terminals, forming solder resist, and/or a cutting process.

Figure 1:
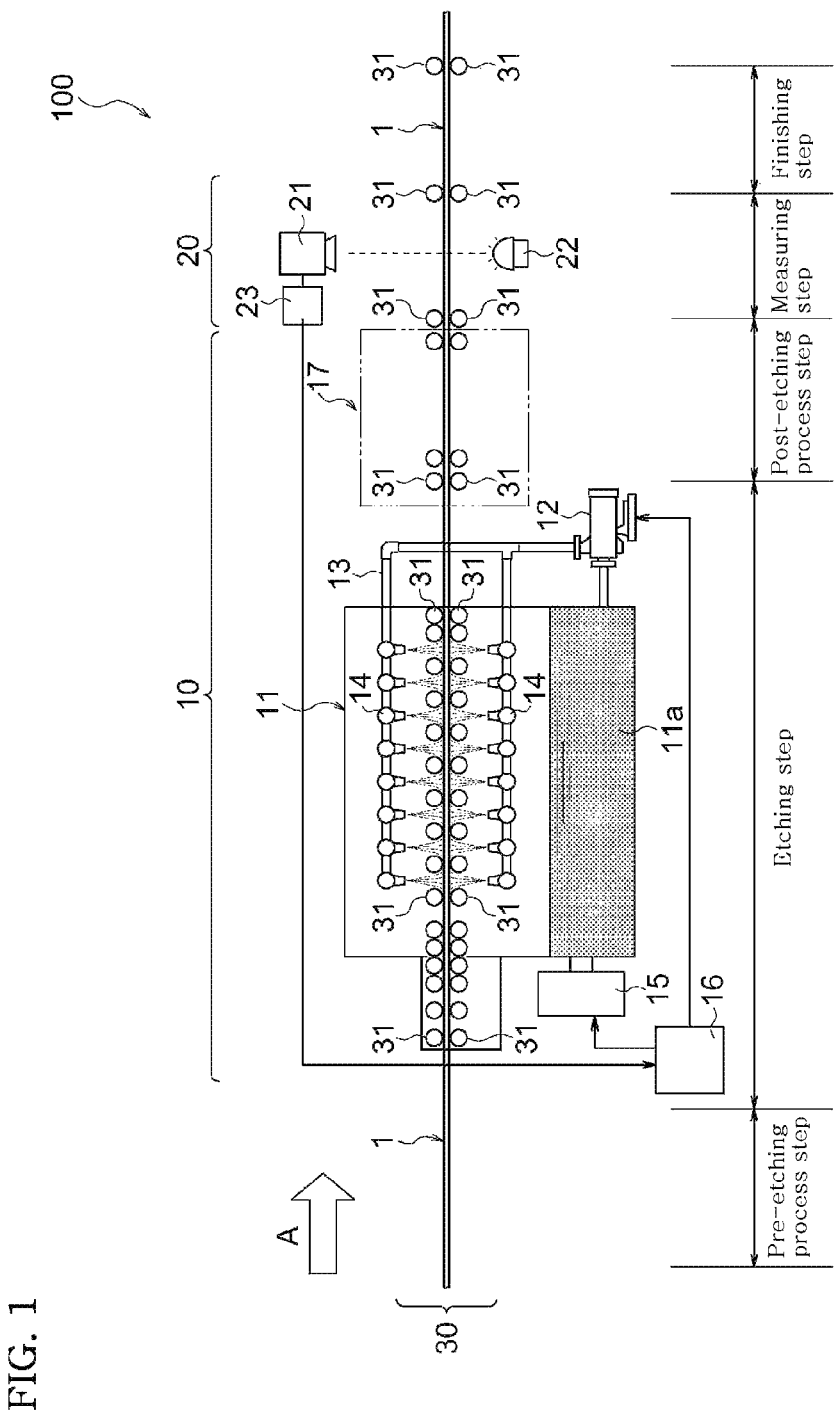
FIG. 1 is a side elevational view illustrating a printed wiring board manufacturing apparatus to which the method for manufacturing a printed wiring board according to embodiments of the present invention is applied.

FIG. 1 is a side elevational view of a printed wiring board manufacturing apparatus 100 to which the method for manufacturing a printed wiring board according to embodiments of the present invention is applied. The printed wiring board manufacturing apparatus 100 shown in FIG. 1 comprises at least an etching apparatus 10, one or more measuring apparatuses 20, and a carrying apparatus 30.

The above etching process and post-etching process are performed by the etching apparatus 10 while the measuring process is performed by the measuring apparatuses 20. Further, the carrying apparatus 30 is capable of supporting and carrying one or more elongate works (conductor-clad base materials) along the processing direction A thereof so that the above processes are allowed to be continuously performed.

As shown in FIG. 1, the etching apparatus 10 comprises: an etching bath 11 for storing etching liquid 11a; a pump 12 capable of being inverter-controlled and for sending out the etching liquid 11a with predetermined pressure and flow rate; flow paths 13 for carrying the sent out etching liquid 11a; and spray nozzles 14 for spraying the sent out etching liquid 11a by the pump 12 to a conductor-clad base material 1 as a work.

In addition, the etching apparatus 10 shown in FIG. 1 comprises an etching liquid management apparatus 15 used for controlling conditions of the etching liquid, such as temperature, concentration and viscosity of the etching liquid. The etching liquid management apparatus 15 includes heaters for heating the etching liquid 11a within the etching bath 11 and an etchant supplying apparatus capable of adding constituents constituting the etching liquid 11a with respective certain amounts.

Further, the etching apparatus 10 shown in FIG. 1 comprises a control apparatus 16 which outputs control instructions based on line widths to the above pump 12 and the etching liquid management apparatus 15. If the control apparatus 16 transmits control instructions to the pump 12, then the pump 12 performs control for the sending-out pressure and/or flow rate of the etching liquid in response to those control instructions. In like manner, if the control apparatus 16 transmits control instructions to the etching liquid management apparatus 15, then the etching liquid management apparatus 15 performs control such that the etching liquid 11a is heated in response to those control instructions according to a certain energy, and in addition to or independently from this, one or more constituents of the etching liquid 11a are added to the etching bath 11 with respective certain amounts.

A post-etching processing apparatus 17 is provided at the downstream side of the etching bath 11. This post-etching processing apparatus 17 performs a cleaning process for washing away the etching liquid, stripping of the resist layer, and a further cleaning process thereafter.

The measuring apparatuses 20 are provided at the further downstream side of the post-etching processing apparatus 17. As shown in FIG. 1, each measuring apparatus 20 according to the present embodiment comprises a camera 21, a light source 22, and an image processing apparatus 23. The camera 21 is provided above the carrying apparatus 30 while the light source 22 is provided at a position opposing the camera 21 with respect to the conductor-clad base material 1. The image processing apparatus 23 measures the line width of each line-like pattern on the bases of the picked-up image taken by the camera 21 with a predetermined period and outputs the result to the control apparatus 16.

The method for manufacturing a printed wiring board according to embodiments of the present invention will be described hereinafter, which is applied to the above manufacturing apparatus 100.

The conductor-clad base material 1 is prepared first. The conductor-clad base material 1 used in the present embodiment is an elongate base material which is continuous along a certain direction. The conductor-clad base material 1 according to the present embodiment is configured such that conductive layers, such as copper foils with thickness of about 5 µm to 80 µm, are formed on main surfaces of an insulating layer, such as polyimide with thickness of about 5 µm to 200 µm, which has flexibility. Polyethylene terephthalate, polyethylene naphthalate or polyester may also be used as a material for the insulating layer.

As shown in FIG. 1, the conductor-clad base material 1 according to the present embodiment is suspended across the carrying apparatus 30 along the progressing direction (arrow A) in the etching process. During each process in each step, the conductor-clad base material 1 is supported by rollers 31 of the carrying apparatus 30 and carried along the progressing direction (arrow A) in the etching process. Note that a plurality of conductor-clad base materials 1 each in sheet-like state may be attached to a tape with adhesive layer into an elongated state thereby also being used as the conductor-clad base material 1 according to the present embodiment.

The prepared conductor-clad base material 1 previously undergoes the pre-etching process step, such as a surface conditioning process, forming of photo sensitive resist, an exposure process and an image developing process, and thereafter progresses to the etching step to enter the etching apparatus 10.

In the etching apparatus 10 according to the present embodiment, a predetermined region of the conductor layer of one main surface of the conductor-clad base material 1 is subjected to the etching process using etching liquid, such as ferric chloride solution, copper chloride solution, hydrogen peroxide water and alkaline etchant liquid, thereby to form wiring patterns to be of a product and inspection patterns to be used for inspection.

Figure 2:
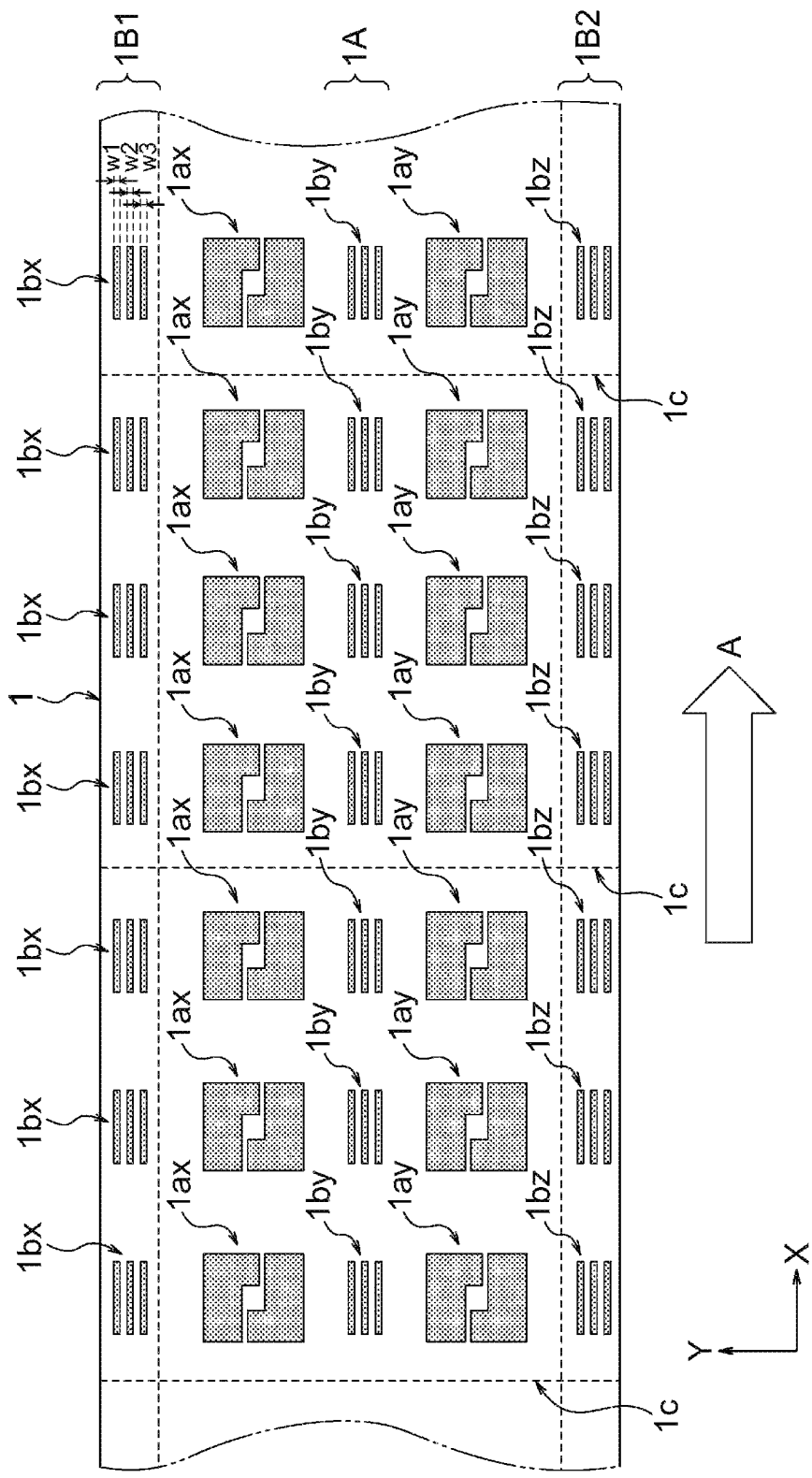
FIG. 2 is a plan view of a conductor-clad base material to which the method for manufacturing a printed wiring board according to embodiments of the present invention is applied.

FIG. 2 is a plan view illustrating a part of the conductor-clad base material 1 formed thereon with wiring patterns and inspection patterns. Arrow A in the figure represents a certain direction along which the conductor-clad base material 1 is to be carried. As shown in FIG. 2, the main surface of the conductor-clad base material 1 is provided thereon with a plurality of wiring patterns 1ax and 1ay (also referred collectively to as "wiring patterns 1a") to be of products and a plurality of inspection patterns 1bx, 1by and 1bz (also referred collectively to as "inspection patterns 1b") to be used for inspection. Note that broken lines 1C in FIG. 2 represent connections between each two sheets when the conductor-clad base material 1 comprises a plurality of conductor-clad base materials each in sheet-like state and each attached to next one.

Wiring patterns 1a include wiring patterns 1ax and wiring patterns 1ay formed to be at different locations in the direction perpendicular to the certain direction (arrow A), both being aligned along the certain direction.

Inspection patterns 1b, which are also aligned along the certain direction (arrow A), include first inspection patterns 1bx, second inspection patterns 1by and third inspection patterns 1bz formed to be at different locations in the direction perpendicular to the certain direction. As shown in FIG. 2, the first inspection patterns 1bx are arranged at one lateral edge area of the conductor-clad base material 1 along the certain direction, the second inspection patterns 1by are arranged at center area of the conductor-clad base material 1 along the certain direction, and the third inspection patterns 1bz are arranged at the other lateral edge area of the conductor-clad base material 1 along the certain direction.

The reason that the plural types of inspection patterns 1b are provided at different locations in the substantially perpendicular direction to the certain direction within the conductor-clad base material 1, i.e. at different locations in the lateral direction of the conductor-clad base material 1 is to evenly perform inspection of line widths for the entire main surface of the conductor-clad base material 1.

As shown in FIG. 2, by providing respective inspection patterns 1b at one lateral edge area 1B1, at center area 1A and at the other lateral edge area 1B2 of the conductor-clad base material 1, line widths of the inspection patterns 1b formed on both lateral edge areas and center area can be respectively inspected, thereby resulting in that the wiring patterns 1a formed on the entire main surface of the conductor-clad base material 1 are allowed to be evenly inspected and it is also possible to determine whether or not deviations occur in etching conditions.

Moreover, the formation of the inspection patterns 1b along the certain direction (arrow A) enables images of the inspection patterns 1b to be taken with fixed cameras because the positions of the inspection patterns 1b may not be out of alignment even when the conductor-clad base material 1 is being carried.

Furthermore, with respect to inspection patterns, such as the inspection patterns 1bx and 1bz, formed at lateral edge areas along the carrying direction of the conductor-clad base material 1, the measuring apparatuses 20 for measuring line widths of those line-like patterns are allowed to be provided within edge regions of the etching line, where positional adjustments for components such as cameras of the measuring apparatuses 20 can be easily performed, and the wiring patterns 1a are thus prevented from being attached thereto with dust falling from cameras and other components. In addition, the formation of the inspection patterns 1b on the conductor-clad base material 1 may not lead to deterioration in material yield because lateral edge areas of the conductor-clad base material 1 along the carrying direction are trimming areas where any product is not to be made.

As shown in FIG. 2, the inspection patterns 1b according to the present embodiment are line-like patterns formed in parallel to one another along the certain direction (arrow A). Although the shape of the inspection patterns 1b is not particularly limited, it is preferred to employ a shape, such as parallelogram, trapezoid or rectangle, having two parallel sides along the certain direction. The inspection patterns 1b have predetermined line widths (W1 to W3). The line widths W1 to W3 are of the same value in the present embodiment (W1=W2=W3), but different values are also possible.

In contrast, the wiring patterns 1a are not comprised only of patterns along the certain direction while being arranged such that complicated patterns are formed along various directions, and it is therefore extremely difficult to measure the line widths thereof when carrying the conductor-clad base material 1. For this reason, embodiments of the present invention configure the inspection patterns 1b as being simple line-like patterns thereby to allow for measuring line widths thereof even when carrying the conductor-clad base material 1.

For the wiring patterns 1a and the inspection patterns 1b in the present embodiment, etching resists are simultaneously formed and the etching process is performed at the same time. In other words, according to the manufacturing method of the present embodiment, line widths of the inspection patterns 1b can be regarded as representing line widths of the wiring patterns 1a, because the conductive layer of the conductor-clad base material 1 is removed under the common condition for forming the wiring patterns 1a and the inspection patterns 1b. Therefore, according to the present embodiment, line widths of the wiring patterns 1a after the etching process can be accurately inspected using line widths of the inspection patterns 1b.

Further, if the inspection patterns 1b are comprised of a plurality of line-like patterns, then the number of the line-like patterns may be compared to prevent scratches on the conductor-clad base material 1 from being erroneously recognized as the inspection patterns 1b.

In particular, if the inspection patterns 1b are made as three or more line-like patterns, then the patterns can be distinguished from characters, such as alphabet "E", formed by etching on the conductor-clad base material 1, and product codes and other symbols on the conductor-clad base material 1 can thus be prevented from being erroneously recognized as the inspection patterns 1b.

After having completed the heretofore described etching process, the conductor-clad base material 1 as a work undergoes the post-etching process step, such as cleaning process, resist stripping process, cleaning process after resist stripping and drying process, followed by the subsequent measuring process.

During the measuring process, the measuring apparatuses 20 measure line widths of the inspection patterns 1b. As described with reference to FIG. 1, the rear surface (the other main surface) to the predetermined regions including the inspection patterns 1b to be imaging objectives are exposed to light from the light sources, and the cameras 21 take images of the predetermined regions including the inspection patterns 1b from the side of the one main surface of the conductor-clad base material 1.

Although not particularly limited, it is preferred that the conductive layer is preliminarily removed from regions on the other main surface of the conductor-clad base material 1 corresponding to the inspection patterns 1*b*, that is, on the rear surface side of the predetermined regions to be taken images. The reason of this is that, if such conductive layer remains within regions corresponding to the inspection patterns 1*b*, then light from the light sources is hard to transmit therethrough and sharp images may not be taken due to insufficient light quantity.

The image processing apparatus 23 extracts outer edges of (performs edge detection process for) the inspection patterns 1*b* included in the obtained images to measure the line widths of those line-like patterns. The image processing apparatus 23 transmits information regarding the line widths to the control apparatus 16.

Figure 3:
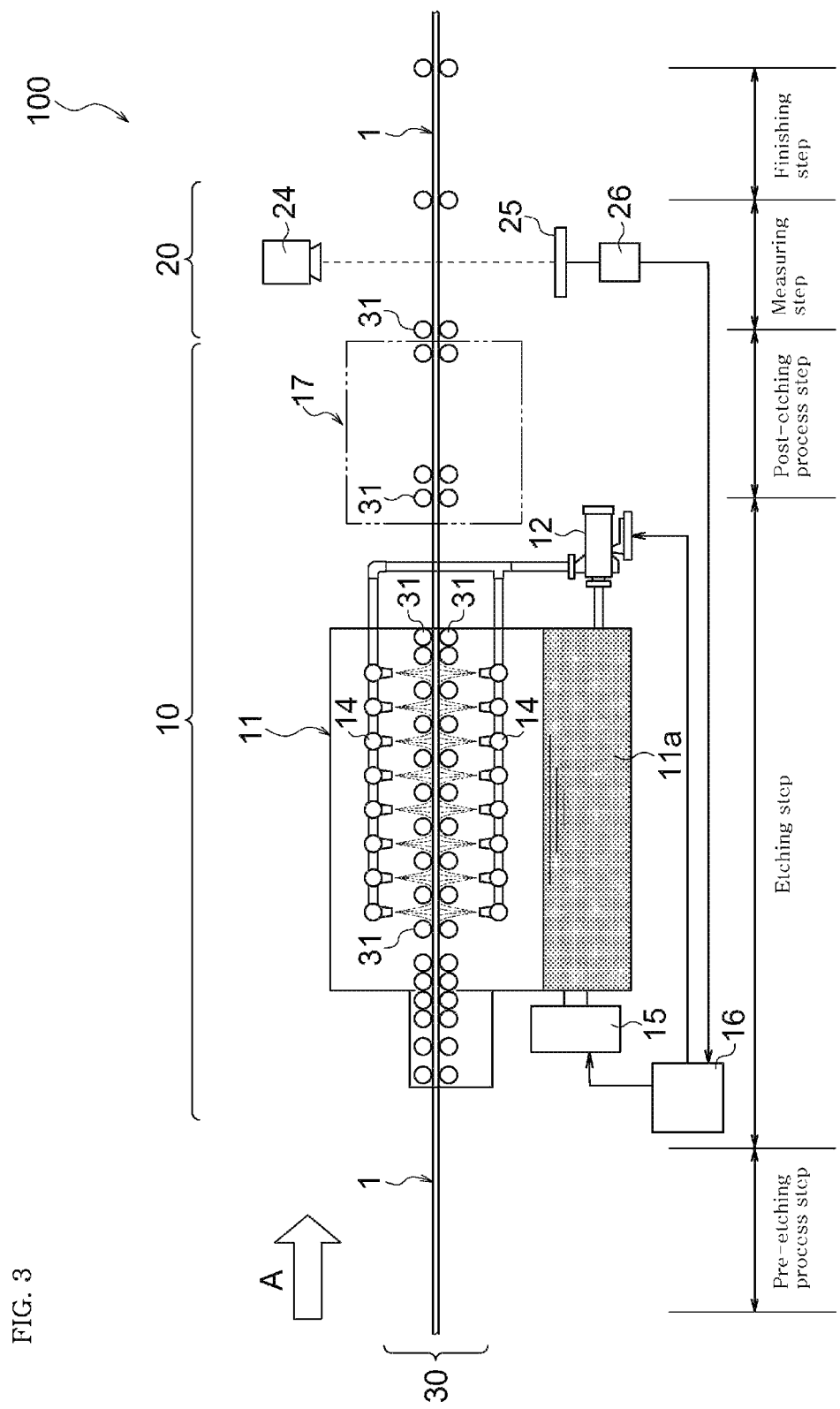
FIG. 3 is a view illustrating another example of the printed wiring board manufacturing apparatus shown in FIG. 1.

Besides, FIG. 3 is a view illustrating a printed wiring board manufacturing apparatus 100 which comprises another type of measuring apparatuses 20. As shown in FIG. 3, each measuring apparatus 20 comprises a laser light source 24, a detector 25, and a light quantity data processing apparatus 26. The laser light source 24 is provided above the carrying apparatus 30 while the detector 25 is provided at a position opposing the laser light source 24 with respect to the conductor-clad base material 1.

Although not particularly limited, it is preferred that the conductive layer is preliminarily removed from regions on the other main surface of the conductor-clad base material 1 corresponding to the inspection patterns 1*b*, that is, from regions through which optical detection is performed from the rear surface side. The reason of this is that, if such conductive layer remains within the regions corresponding to the inspection patterns 1*b*, then light from the laser light sources 24 is hard to transmit therethrough and the transmitted laser light may be insufficiently received thereby to result in that an accurate distribution data of light quantity may not be obtained.

The light quantity data processing apparatus 26 extracts outer edges of the inspection patterns 1*b* from the obtained distribution data of light quantity to measure the line widths of those line-like patterns. The light quantity data processing apparatus 26 transmits information regarding the line widths to the control apparatus 16.

Alternatively, it may be possible that laser light is emitted to the inspection patterns 1*b* from the side of the one main surface of the conductor-clad base material 1, light reflected from the surfaces of the inspection patterns 1*b* is received, and the line widths of the inspection patterns 1*b* are measured on the basis of this received light data. In this case, it is preferred that the conductive layer still remains within regions on the other main surface of the conductor-clad base material 1 corresponding to the inspection patterns 1*b*, that is, on the rear surface side of predetermined regions to be exposed to laser light. The reason of this is that, if such conductive layer still remains within the regions corresponding to the inspection patterns 1*b*, then light from the laser light sources is hard to transmit therethrough and the reflected laser light may be enhanced thereby to result in that an accurate distribution data of light quantity may be obtained.

Since the conductor-clad base material 1 in the present embodiment is formed thereon with the inspection patterns 1*bx*, the second inspection patterns 1*by* and the third inspection patterns 1*bz* which are at different locations in the direction perpendicular to the certain direction (carrying direction) as described above, respective three measuring apparatuses 20 are accordingly provided for taking images of the first to the third inspection patterns 1*b*.

Specifically, the three measuring apparatuses 20 in the present embodiment are provided along the direction perpendicular to the plane of the page (along the lateral direction of the set conductor-clad base material 1) at respective positions: a position corresponding to one lateral edge area of the conductor-clad base material 1 (denoted by 1B1 in FIG. 2); a position corresponding to the center area of the conductor-clad base material 1 (denoted by 1A in FIG. 2); and a position corresponding to the other lateral edge area of the conductor-clad base material 1 (denoted by 1B2 in FIG. 2).

The measuring apparatuses 20 respectively measure a first line width of line-like patterns of the first inspection patterns 1*bx*, a second line width of line-like patterns of the second inspection patterns 1*by*, and a third line width of line-like patterns of the third inspection patterns 1*bz*. The measuring apparatuses 20 in the present embodiment transmit each measured line width to the control apparatus 16 after adding thereto with positional information representing the position at which that line width was measured. This positional information may include positional information for the location where the corresponding measuring apparatus 20 is placed, positional information for the positions of the measured inspection patterns 1*b* on the main surface of the conductor-clad base material 1, and other information. Alternatively or additionally, identifiers assigned to the measuring apparatuses 20 may also be used as positional information. The reason of this is that, if the corresponding measuring apparatus 20 is identified, then the measuring location thereof will be known from the identifier.

In the manufacturing apparatus 100, the positional information is associated with positional information of spray nozzles of the etching apparatus 10, positional information within the bottom face of the etching bath 11, and other information. That is, the printed wiring board manufacturing apparatus 100 according to the present embodiment can specify, based on positional information associated with line widths, positions of respective spray nozzles 14 opposing the first inspection patterns 1*bx*, the second inspection patterns 1*by* and the third inspection patterns 1*bz* and spraying etching liquid 11*a* thereto, and positions of the etching bath 11 where respective inspection patterns 1*bx* to 1*bz* pass through.

The control step for etching conditions will then be described. The control step for etching conditions according to embodiments of the present invention involves the control apparatus 16. The control apparatus 16 controls etching conditions on the basis of the measured line widths of the inspection patterns 1*b* in the measuring step described above.

The control apparatus 16 according to the present embodiment obtains line width of each line-like pattern of the inspection patterns 1*b* measured by the measuring apparatuses 20, and controls etching conditions based on the obtained line width with reference to correspondence information which preliminarily associates line widths of the inspection patterns 1*b* with etching conditions in the etching step.

First, the control apparatus 16, when obtaining line widths of the inspection patterns 1*b* from the measuring apparatus 20, confirms whether the obtained values are derived from the line widths (W1 to W3) of line-like patterns of the inspection patterns 1*b*. The reason of performing this operation is to confirm before generating control instructions whether other patterns, scratches or printings on the conductor-clad base material 1 are erroneously recognized as the inspection patterns 1*b*.

In particular, if the line widths (W1 to W3) of line-like patterns are of the identical line width (W1=W2=W3) and each difference between the obtained line widths of the plural line-like patterns is less than a predetermined value, then the control apparatus 16 determines that the obtained line widths are derived from the line widths (W1 to W3) of line-like patterns of the inspection patterns 1b. On the other hand, if the line widths (W1 to W3) of line-like patterns are of the identical line width (W1=W2=W3) while nevertheless each difference between the obtained line widths of the plural line-like patterns is more than or equal to the predetermined value, then the control apparatus 16 determines that the obtained line widths are not derived from the line widths of line-like patterns of the inspection patterns 1b. Thereafter, if each difference between the obtained line widths is less than the predetermined value, the control apparatus 16 controls etching conditions on the basis of the obtained line widths, whereas if each difference between the obtained line widths is more than or equal to the predetermined value, the control apparatus 16 continues the immediately previous control without controlling etching conditions based on the obtained line widths.

Thus, by comparing for line widths of plural line-like patterns having been preliminarily formed with predetermined line widths, it can be determined whether or not those line-like patterns are parts of the inspection patterns 1b. This allows for preventing scratches or printings on the surface of the conductor-clad base material 1 to be erroneously recognized as the inspection patterns 1b.

Subsequently, the control apparatus 16 obtains line widths or evaluation values for line widths to be used for control. If there is obtained one value of line width from a measuring apparatus 20, then the control apparatus 16 can control etching conditions on the basis of that line width. If, however, line widths and positional information are obtained from plural measuring apparatuses 20, then the use of positional information associated with each line width allows for controlling etching conditions corresponding to respective inspection patterns 1b on the basis of the line widths of respective inspection patterns 1b.

Further, if plural line widths are obtained from the measuring apparatuses 20 located at different positions, then etching conditions can be controlled on the basis of one evaluated value obtained from those plural line widths. Here, approaches for obtaining one evaluated value from plural line widths are such that, but not limited to, the evaluated value is obtained as a representative value, such as an average value, a median value or a standard value of the obtained measured values, or the evaluated value is based on deviations of the actually measured values in terms of a predefined reference value (design value) of line width.

Thus, by controlling etching conditions on the basis of line widths of the inspection patterns 1b formed at different positions of the conductor-clad base material 1, etching conditions can be controlled such that wiring patterns 1a with line widths approximated to a reference value (designed value) are formed at any locations on the conductor-clad base material 1.

The control apparatus 16 then refers to correspondence information which preliminarily associates line widths of the inspection patterns 1b with etching conditions in the etching step.

Although not particularly limited, examples of etching conditions affecting line widths of the inspection patterns 1b include temperature, concentration, copper concentration, iron concentration and viscosity of etching liquid, spray pressure when spraying etching liquid to the conductor-clad base material 1, drop size of spraying, carrying speed of work (conductor-clad base material 1), discharging speed of etching liquid from the conductor-clad base material 1, and other factors. The control apparatus 16 can perform the control using one of these conditions or combination of two or more thereof.

Figure 4:
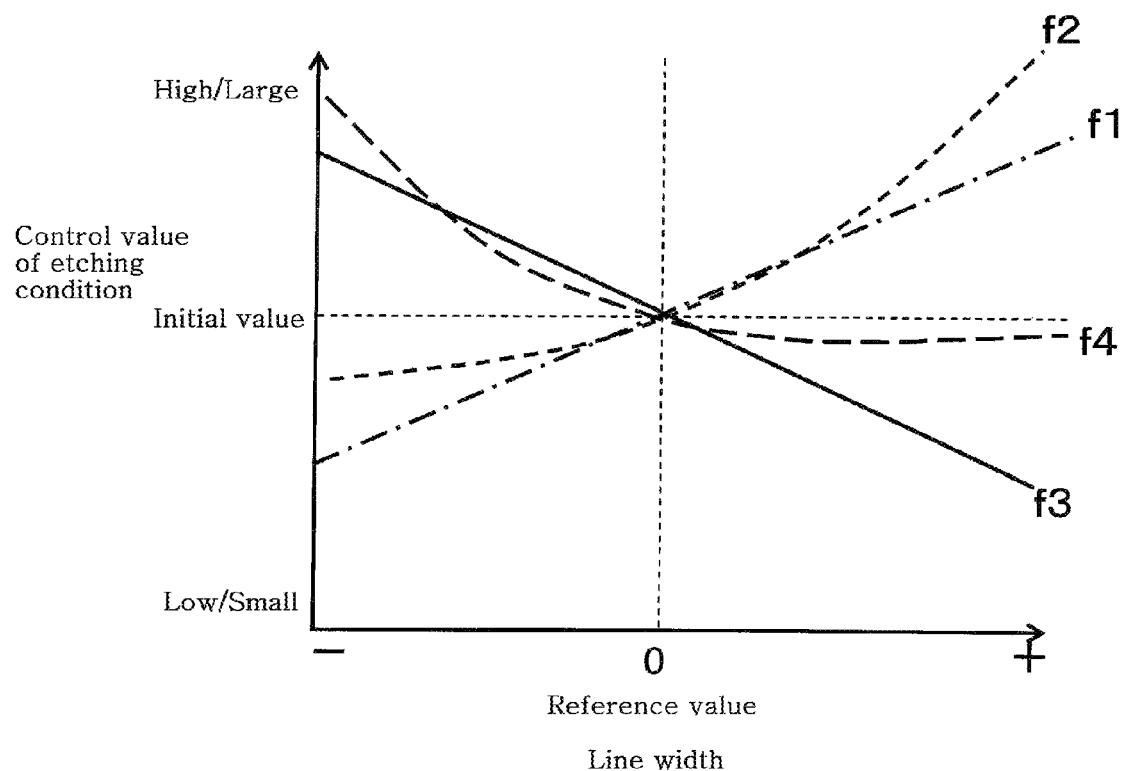
FIG. 4 is a diagram illustrating one example of correspondence information to be used in the method for manufacturing a printed wiring board according to embodiments of the present invention.

FIG. 4 is a diagram illustrating one aspect of correspondence information. As shown in FIG. 4, correspondence information associates line widths with etching conditions. In this example, origin coordinate represents the reference value (design value) of line width and the initial value of etching control, and control values are defined in accordance with increasing and decreasing of line widths to the reference value (designed value). More specifically, correspondence information in the present embodiment defines control values of etching conditions for approximating line widths of the inspection patterns 1b to be subsequently formed to the reference value (designed value) in response to differences between the measured line widths and the reference value (designed value) which is an ideal line width.

Although not particularly limited, the correspondence relationship between line widths and control values may be represented by increasing functions f1 and f2, decreasing functions f3 and f4, or other appropriate functions, as shown in FIG. 4, and other than monotonic increase or decrease as shown in FIG. 4, may also be represented by a function involving any extremal value (increasing and decreasing). Such correspondence relationships may be obtained by way of experiment.

For example, if the control value of etching conditions is the spray pressure when spraying etching liquid to the conductor-clad base material 1 and line widths tend to be increased relative to the reference value, then it is appropriate to adjust the spray pressure to be a higher pressure than the initial value in order to increase the efficiency of the etching process. As such, the correspondence relationship between the spray pressure and the line width may be defined by an increasing function such as functions f1 and f2.

Similarly, the correspondence relationship between the temperature of etching liquid and the line width or the correspondence relationship between the concentration of etching liquid and the line width may also be defined by an increasing function such as function f1 or f2.

If, however, the control value of etching conditions is the carrying speed of the conductor-clad base material 1 and line widths tend to be increased relative to the reference value, then it is appropriate to adjust the carrying speed to be a lower speed than the initial value in order to extend the etching time. As such, the correspondence relationship between the carrying speed and the line width may be defined by a decreasing function such as function f3 or f4.

Also with respect to the correspondence relationship between the discharging speed of etching liquid from the conductor-clad base material 1 and the line width, if the line widths tend to be increased relative to the reference value, then it is appropriate to adjust the discharging speed of etching liquid to be a lower speed than the initial value in order to extend the etching time. Further, with respect to the correspondence relationship between the viscosity of etching liquid and the line width, if the line widths tend to be increased relative to the reference value, then it is appropriate to reduce the viscosity in order to facilitate diffusion, because the increased viscosity restricts diffusion. As such, the correspondence relationship between the discharging speed and the line width or the correspondence relationship between the viscosity of etching liquid and the line width may be defined by a decreasing function such as the functions f3 or f4.

Note, however, that ferric chloride etching liquid has an optimum concentration of ferric chloride where the etching speed comes to be maximum, thus tending to result in that the etching speed is reduced if the concentration is unduly high. Note also that copper chloride etching liquid has an optimum concentration of copper chloride where the etching speed comes to be maximum, thus tending to result in that the etching speed is reduced if the concentration is unduly high. Correspondence relationships in such cases are preferred to be defined based on experiments by functions involving some extremal values (increasing and decreasing) rather than by relationships of monotonic increase or decrease.

Moreover, the correspondence relationship may associate the line widths with plural etching conditions. For example, the dissolution of copper chloride requires chlorine ions and the increased hydrochloric acid concentration thus tends to increase the etching speed, and therefore, as the correspondence relationship in such a case, it is preferred that the corresponding relationship is defined to associate both the copper concentration and the hydrochloric acid concentration with the line widths, rather than the correspondence relationship would be defined merely by the copper concentration and the line width. Thus, in the case where such multiple etching conditions act, the correspondence relationship is preferred to be defined based on the experimental results to have plural conditions as control targets.

The control apparatus 16 refers to the correspondence information on the basis of line widths obtained (measured) for every predetermined period to change the control values of the present etching conditions to control values depending on newly obtained line widths. In addition, if the measured line width exceeds a predetermined control range, the etching apparatus 10 may also change the control value. This control range is a certain range preliminarily and freely selected based on the reference value (designed value). By repeating such controls, it can be expected that the line width will converge to the reference value after newly undergoing the etching process and being newly measured.

Furthermore, the control apparatus 16 can also independently set the control values of etching conditions for individual parts such as respective spray nozzles 14. As described above, the conductor-clad base material 1 in the present embodiment is formed thereon with the first inspection patterns 1bx, the second inspection patterns 1by and the third inspection patterns 1bz which are at different locations in the direction perpendicular to the certain direction (carrying direction), and positional information is added to line widths of line-like patterns of each inspection pattern 1b. Consequently, the control apparatus 16 can control respective etching conditions corresponding to respective inspection patterns 1b and therefore affecting the etching process for the inspection patterns 1b, on the basis of the line widths of respective measured inspection patterns 1b. For example, the control apparatus 16 can individually control, based the line widths of the first inspection patterns 1bx provided on one edge area of the conductor-clad base material 1, only the spray pressure of spray nozzles 14 group for spraying etching liquid 11a to those inspection patterns 1bx.

Thus, according to the present embodiment in which the line width values of the inspection patterns 1b and the control values of etching conditions are associated with each other in the correspondence information, the control values of etching conditions can be feed-back controlled such that the line widths of the sequentially formed inspection patterns 1b approximates to the reference value (designed value). Accordingly, it can be expected that the line widths of the inspection patterns 1b and the wiring patterns 1a to be subsequently subjected to the etching process approximate the reference value (designed value). This allows for reducing the varieties in properties of the manufactured printed wiring boards.

Meanwhile, according to conventional approaches for inspection, the percent defective of products has been inspected such that, if line widths are within a tolerable range after being measured for completed printed wiring boards, then they are determined to be non-defective products, whereas if line widths are not within the tolerable range, then they are determined to be defective products. According to this approach, however, it is difficult to make known the correspondence relationship between the percent defective and the etching conditions, and it is also difficult to immediately make changes to the etching conditions on the basis of the percent defective, causing delay in making changes. Consequently, the deterioration in production yield has been inevitable because there continues the tendency of being formed with increased line widths or otherwise with decreased line widths depending on the etching conditions.

In contrast, according to the present embodiment, the etching conditions are allowed to be feed-back controlled based on the line width values of the inspection patterns 1b measured after the etching process and with reference to predefined correspondence information between the line widths and the etching conditions, and the etching conditions can thus be immediately changed and appropriately maintained thereby to prevent the production yield from being deteriorated due to insufficient etching conditions.

Moreover, while the variability in line widths (circuit widths) of the wiring patterns 1a causes variation in impedances, the manufacturing method according to the present embodiment can appropriately maintain the etching conditions to suppress such variability in line widths (circuit widths) of the wiring patterns 1a. Therefore, the manufacturing method according to the present embodiment enables to improve the quality of printed wiring boards particularly for being impedance ($Z_0$) controlled.

It should be appreciated that the embodiments heretofore explained are described to facilitate understanding of the present invention and are not described to limit the present invention. Therefore, it is intended that the elements disclosed in the above embodiments include all design changes and equivalents to fall within the technical scope of the present invention.

For example, while the present embodiment has been described for the method for manufacturing printed wiring boards in which the measuring process and the controlling process for etching conditions are performed after the post-etching process step, the measuring process and the controlling process may also be performed immediately after the etching process (before the post-etching process step). This allows the line width data of the inspection patterns formed through the etching process to be immediately fed-back as controlling factors for etching conditions, thereby to more quickly make changes to the etching conditions.

In addition, the measuring process and the controlling process may not be performed immediately after the etching process, but be performed during the post-etching step and/or the finishing step. Performing the measuring process and the controlling step in such timing allows the etching conditions to be more quickly changed than the case where the line widths are inspected after the finishing step, i.e. after completing printed wiring boards, as is in the conventional technique. As a result, time duration during which the etching conditions are inappropriate may be reduced, and the production yield may thus be suppressed from being deteriorated due to continuing to produce defective products.

In this way, making changes to the etching conditions at early timing after the etching process enables the etching conditions to be changed during the process for base materials within the same lot, that is, to be changed before completing the process for base materials within one lot. Therefore, an additional feature may be expected that the variation in products group occurring within the same lot will also be suppressed.

DESCRIPTION OF REFERENCE NUMERALS

100 . . . printed wiring board manufacturing apparatus
10 . . . etching apparatus
   11 . . . etching bath
   11a . . . etching liquid
12 . . . pump
13 . . . flow path
14 . . . spray nozzle
15 . . . etching liquid management apparatus
16 . . . control apparatus
17 . . . post-etching processing apparatus
20 . . . measuring apparatus
   21 . . . camera
   22 . . . light source
   23 . . . image processing apparatus
   24 . . . laser light source
   25 . . . detector
   26 . . . light quantity data processing apparatus
30 . . . carrying apparatus
   31 . . . roller
1 . . . conductor-clad base material
   1a . . . wiring pattern
   1ax . . . first wiring pattern, wiring pattern
   1ay . . . second wiring pattern, wiring pattern
   11b . . . inspection pattern
   1bx . . . first inspection pattern, inspection pattern
   1by . . . second inspection pattern, inspection pattern
   1bz . . . third inspection pattern, inspection pattern

What is claimed is:

1. A method for manufacturing a printed wiring board, the method comprising:
an etching step that comprises: preparing a conductor-clad base material continuous in a certain direction, supporting and carrying the conductor-clad base material along the certain direction, the conductor-clad base material having an insulating layer and one or more conductive layers formed on main surfaces of the insulating layer; and subjecting a predetermined region of a conductor layer of one main surface of the conductor-clad base material to an etching process thereby to form a wiring pattern to be of a product and an inspection pattern to be used for inspection;
a measuring step that measures a line width of the inspection pattern after the etching step; and
a control step that controls an etching condition in the etching step based on the measured line width;
wherein the inspection pattern comprises a plurality of line-like patterns parallel to one another along the certain direction, and wherein each of the line-like patterns has a predetermined line width;
wherein, when each difference between line widths of the plurality of line-like patterns is less than a predetermined value, then the control step controls the etching condition based on the line widths of that plurality of line-like patterns, whereas when each difference between line widths of the plurality of line-like patterns is more than or equal to the predetermined value, then the control step determines that plurality of line-like patterns as not being the inspection pattern and stops controlling the etching condition based on the line widths of that plurality of line-like patterns and continues an immediately previous control.

2. The method for manufacturing a printed wiring board as set forth in claim 1, wherein the control step refers to correspondence information which preliminarily associates the line width of the inspection pattern and the etching condition in the etching step with each other, and wherein the control step controls the etching condition based on the measured line width.

3. The method for manufacturing a printed wiring board as set forth in claim 1, wherein the inspection pattern comprises three or more line-like patterns.

4. The method for manufacturing a printed wiring board as set forth in claim 1, wherein the inspection pattern includes inspection patterns positioned at different positions in substantially perpendicular direction to the certain direction, and
the control step controls etching conditions corresponding to respective inspection patterns based on line widths of the respective inspection patterns measured in the measuring step.

5. The method for manufacturing a printed wiring board as set forth in claim 1, wherein the measuring step takes an image of the inspection pattern from one main surface side of the conductor-clad base material in a state of the inspection pattern being exposed to light from other main surface side of the conductor-clad base material, and measures the line width of the inspection pattern based on the taken image.

6. The method for manufacturing a printed wiring board as set forth in claim 1, wherein the measuring step emits laser light from one main surface side of the conductor-clad base material to the inspection pattern and measures the line width of the inspection pattern based on transmitted light of the laser light.

\* \* \* \* \*